(12) United States Patent
Akahane

(10) Patent No.: US 11,387,642 B2
(45) Date of Patent: Jul. 12, 2022

(54) OVERCURRENT SENSE CONTROL OF SEMICONDUCTOR DEVICE

(71) Applicant: FUJI ELECTRIC CO., LTD., Kanagawa (JP)

(72) Inventor: Masashi Akahane, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 303 days.

(21) Appl. No.: 16/391,328

(22) Filed: Apr. 23, 2019

(65) Prior Publication Data

US 2019/0280473 A1 Sep. 12, 2019

Related U.S. Application Data

(63) Continuation of application No. PCT/JP2018/014134, filed on Apr. 2, 2018.

(30) Foreign Application Priority Data

May 16, 2017 (JP) .............................. JP2017-097300

(51) Int. Cl.
*H02H 3/08* (2006.01)
*H03K 17/08* (2006.01)
(Continued)

(52) U.S. Cl.
CPC ............... *H02H 3/08* (2013.01); *H02M 1/00* (2013.01); *H02M 1/08* (2013.01); *H02M 7/48* (2013.01); *H03K 17/08* (2013.01); *H03K 17/60* (2013.01)

(58) Field of Classification Search
CPC .. H03K 17/08; H03K 17/082; H03K 17/0822; H03K 17/0826; H03K 17/0828;
(Continued)

(56) References Cited

U.S. PATENT DOCUMENTS 5,375,029 A 12/1994 Fukunaga
7,463,079 B2 * 12/2008 De .................. H03K 17/08128
327/309
(Continued)

FOREIGN PATENT DOCUMENTS

JP H06120787 A 4/1994
JP 2013077976 A 4/2013
(Continued)

OTHER PUBLICATIONS

International Search Report for International Patent Application No. PCT/JP2018/014134, issued/mailed by the Japan Patent Office dated Jun. 12, 2018.
(Continued)

*Primary Examiner* — Thienvu V Tran
*Assistant Examiner* — Carlos O Rivera-Perez

(57) ABSTRACT

A control device includes a current detecting section that detects a sense current for a current flowing through a semiconductor element; a transient sensing period detecting section that detects a transient sensing period from a transient rising to a transient falling of a detection signal of the sense current, in response to the semiconductor element being turned ON; and a control section that controls the semiconductor element according to a detection result of the transient sensing period, based on the sense current detection signal. By detecting the transient sensing period with the transient sensing period detecting section and controlling the semiconductor element with the control section according to the transient sensing period detection result, based on the sense current detection signal, it is possible to identify overcurrent according to the transient response detection result of the sense current during the transient sensing period, and to actively protect the semiconductor element.

18 Claims, 11 Drawing Sheets

(51) Int. Cl.
    *H03K 17/60*    (2006.01)
    *H02M 7/48*     (2007.01)
    *H02M 1/08*     (2006.01)
    *H02M 1/00*     (2006.01)

(58) Field of Classification Search
    CPC .... H03K 17/12; H03K 17/122; H03K 17/127; H03K 17/18; H03K 17/60; H03K 17/603; H03K 2217/0027; H02H 3/00; H02H 3/08; H02H 3/083; H02H 3/087; H02H 3/093; H02H 3/0935; H02H 3/105; H02H 3/13; H02H 3/24; H02H 3/247; H02H 3/253; H02H 3/26; H02H 1/00; H02H 1/0007; H02H 1/04; H02H 1/043; H02H 9/02; H02M 7/00; H02M 7/42; H02M 7/44; H02M 7/48; H02M 1/00; H02M 1/08; H02M 1/32; H02M 1/36; H02M 1/0009; H02M 1/0038; G05F 1/569; G05F 1/573
    USPC ........ 361/18, 78, 79, 86, 87, 88, 89, 90, 92, 361/93.1–102, 110, 111; 323/271–278, 323/282–286, 351; 363/50, 55–58
    See application file for complete search history.

(56) References Cited

U.S. PATENT DOCUMENTS

| | | | | |
|---|---|---|---|---|
| 9,837,916 | B1* | 12/2017 | Ptacek | H02M 1/08 |
| 2004/0201935 | A1* | 10/2004 | Yamamoto | H03K 17/0828 |
| | | | | 361/93.1 |
| 2010/0007409 | A1* | 1/2010 | Wang | H02M 3/156 |
| | | | | 327/551 |
| 2013/0083442 | A1 | 4/2013 | Hiyama | |
| 2014/0192449 | A1 | 7/2014 | Shimizu | |
| 2014/0253182 | A1 | 9/2014 | Akiyama | |

FOREIGN PATENT DOCUMENTS

| | | |
|---|---|---|
| JP | 2014171356 A | 9/2014 |
| JP | 2017063265 A | 3/2017 |
| WO | 2013008452 A1 | 1/2013 |

OTHER PUBLICATIONS (ISA/237) Written Opinion of the International Search Authority for International Application No. PCT/JP2018/014134 issued/mailed by the International Bureau of WIPO dated Jun. 12, 2018.

* cited by examiner

OVERCURRENT SENSE CONTROL OF SEMICONDUCTOR DEVICE

The contents of the following Japanese patent applications are incorporated herein by reference: No. 2017-097300 filed in JP on May 16, 2017 and PCT/JP2018/014134 filed on Apr. 2, 2018.

BACKGROUND

1. Technical Field

The present invention relates to a control device and a semiconductor device.

2. Related Art

As next-generation technology for a conventionally used power semiconductor module (also referred to as a semiconductor device) in which an insulated gate bipolar transistor (IGBT) is mounted, a power semiconductor module in which a next-generation semiconductor element such as a silicon carbide compound conductor element (SiC element), a gallium nitride compound semiconductor element (GaN element), or the like is mounted has been under development in recent years. The SiC element and the GaN element have a high withstand voltage, due to the SiC element and GaN element having higher dielectric breakdown electric field strength than a conventional silicon semiconductor element (Si element), and can realize a small semiconductor device that is capable of performing a switching operation with high efficiency and high speed, due to the SiC element and GaN element are able to have higher impurity concentrations and thinner active layers than the conventional Si element.

In the semiconductor device described above, a mechanism is provided to protect the semiconductor elements from overcurrent, which is feared to occur due to a high-speed switching operation, particularly a turn-ON operation. For example, Patent Documents 1 and 2 disclose, as one embodiment, an overcurrent protection circuit in which a current detection resistor is connected to a sense terminal of the insulated gate bipolar transistor (IGBT), and the overcurrent protection circuit detects a sense current corresponding to an emitter current flowing out from the emitter terminal using this current detection resistor and turns OFF the IGBT when overcurrent is detected.

Patent Document 1: Japanese Patent Application Publication No. H6-120787

Patent Document 2: Japanese Patent Application Publication No. 2017-63265

However, there is a concern that the sense current will exhibit transient behavior differing from that of the emitter current due to the current detection resistor being connected to the sense terminal in the overcurrent protection circuit described above and having a different impedance than the emitter terminal as a result of physical differences (length and width of the wire paths, the number of wire bonding, and the like) in the wire paths used in this connection, and that this behavior will cause erroneous detection as overcurrent. When a capacitor that operates as a low-pass filter is connected in parallel with the current detection resistor in order to avoid such erroneous overcurrent detection, detection delay occurs and the protection of the semiconductor elements is late. Furthermore, when a timer is provided to measure time with the rising edge of an input signal as a trigger, and this is used to switch the threshold value for the detection results of the sense current or to change the resistance value of the current detection resistor between the transient state estimation period and a period after this transient state estimation period, there is a problem that although it is possible to avoid erroneous detection during the transient state estimating period in which time measurement is performed by the timer, it is impossible to avoid erroneous detection in the period after this. Although it is possible to solve this problem by making the transient state estimating period longer, there is still the problem of the protection of the semiconductor elements being too late.

SUMMARY (Item 1)

A control device may comprise a current detecting section that detects a sense current for a current flowing through a semiconductor element.

The control device may comprise a transient sensing period detecting section that detects a transient sensing period from a transient rising to a transient falling of a detection signal of the sense current, in response to the semiconductor element being turned ON.

The control device may comprise a control section that controls the semiconductor element according to a detection result of the transient sensing period, based on the detection signal of the sense current.

(Item 2)

The current detecting section may detect a potential occurring in a resistor element through which the sense current flows.

(Item 3)

The transient sensing period detecting section may detect the transient rising and transient falling of the detection signal based on a difference between the detection signal of the sense current and a delayed signal of the detection signal.

(Item 4)

The transient sensing period detecting section may detect the transient sensing period based on a period between the rising and the falling of the detection signal of the sense current.

(Item 5)

The control section may turn OFF the semiconductor element when the detection signal of the sense current exceeds a predetermined threshold value and the transient sensing period exceeds a predetermined time.

(Item 6)

The transient sensing period detecting section may detect a rising period, a falling period, and the transient sensing period between the rising period and the falling period of the detection signal of the sense current.

The control section may detect overcurrent in response to the detection signal of the sense current having exceeded a predetermined first threshold value during the transient sensing period.

(Item 7)

The control section may be prevented from detecting overcurrent during the rising period and during the falling period.

(Item 8)

The transient sensing period detecting section may further detect a steady ON period from after the falling period to when the semiconductor element is turned OFF.

The control section may detect overcurrent in response to the detection signal of the sense current exceeding the second threshold value, which his lower than the first threshold value, during the steady ON period.

(Item 9)

The transient sensing period detecting section may include a state machine that tracks state transition among states corresponding respectively to the rising period, the falling period, the transient sensing period, and the steady ON period.

(Item 10)

A semiconductor device may comprise a semiconductor element.

The semiconductor module may comprise the control device according to any one of Items 1 to 9.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
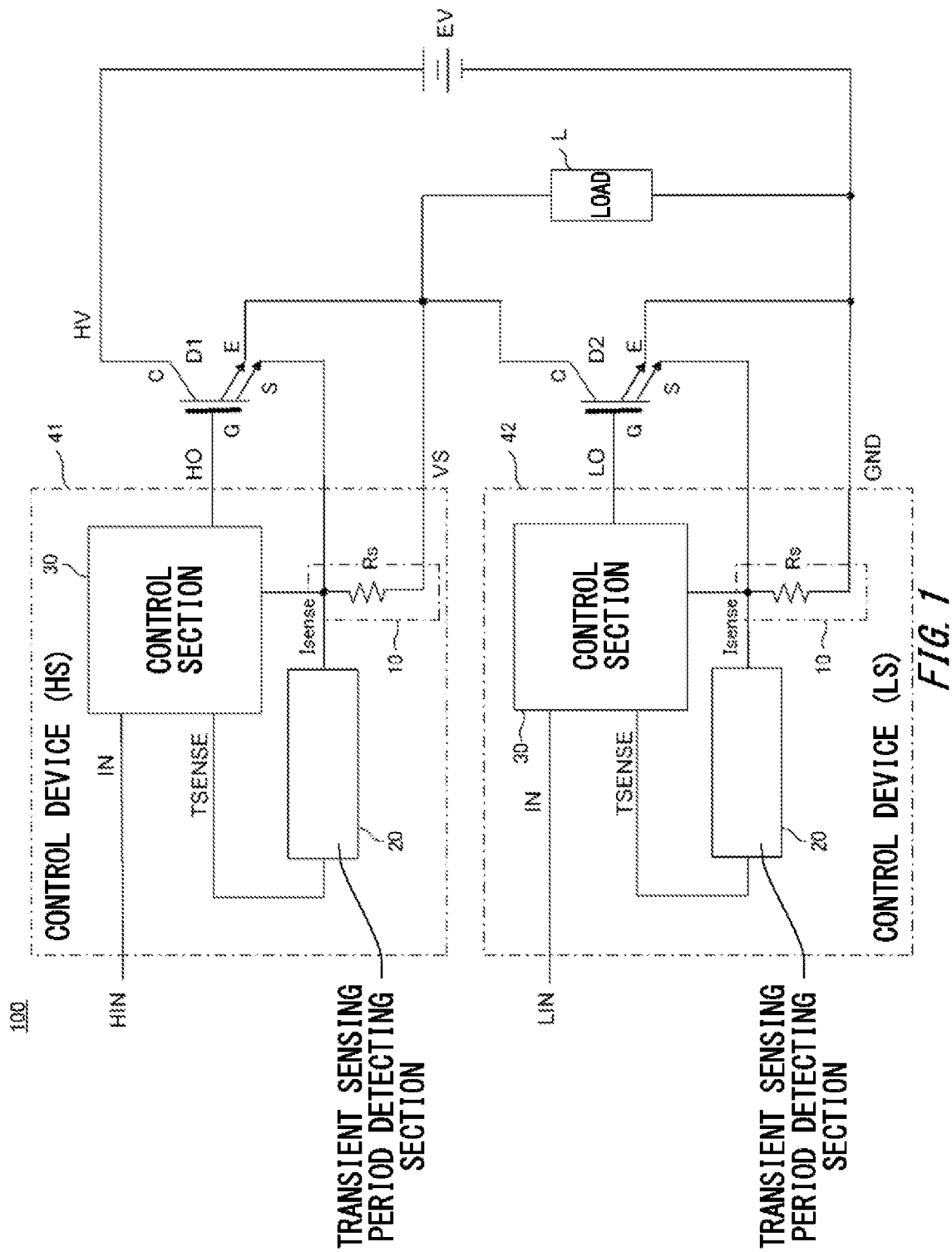
FIG. 1 shows configurations of control devices, and a semiconductor device formed including these control devices, according to the present embodiment.

FIG. 1 shows configurations of control devices 41 and 42, and a semiconductor device 100 including these control devices, according to the present embodiment. It is an objective of the semiconductor device 100 to actively protect a semiconductor element by determining overcurrent from a transient response of a sense current. The semiconductor device 100 includes semiconductor elements D1 and D2 and the control devices 41 and 42, so as to form a half-bridge inverter circuit for a load L and a power source EV, for example, from these components.

The semiconductor elements D1 and D2 are switching elements, and insulated gate bipolar transistors (IGBTs), for example, are adopted as the semiconductor elements D1 and D2. Instead, metal oxide semiconductor field effect transistors (MOSFETs) made from a compound semiconductor such as SiC may be adopted as the semiconductor elements D1 and D2. The semiconductor elements D1 and D2 each include a gate electrode (also referred to simply as a gate), a collector electrode (also referred to simply as a collector), and an emitter electrode (also referred to simply as an emitter), which are connected respectively to a gate terminal G, to a collector terminal C, and to an emitter terminal E and a sense terminal S. The current output from the emitter of each of the semiconductor elements D1 and D2 is split to the emitter terminal E and the sense terminal S.

In the semiconductor device 100, the semiconductor element D1 has its collector terminal C and emitter terminal E respectively connected to a positive pole of the power source EV and one end of the load L, and the semiconductor element D2 has its collector terminal C and emitter terminal E respectively connected to the one end of the load L and the negative pole of the power source EV. Furthermore, the other end of the load L is connected to the negative pole of the power source EV. Here, the potential of the one end of the load L and the potential of the negative pole of the power source EV are respectively represented as VS and GND.

The control devices 41 and 42 are devices that respectively switch the semiconductor elements D1 and D2 by driving the gates in accordance with switching signals HIN and LIN input from the outside, and actively protect the semiconductor elements D1 and D2 by identifying an excessive emitter current (i.e. overcurrent) based on the transient response of the sense current. The switching signals HIN and LIN may be signals corresponding to PWM control from a pulse width modulator (not shown in the drawings), for example. The control devices 41 and 42 are respectively connected to the semiconductor elements D1 and D2, and together with these semiconductor elements D1 and D2 respectively form a high arm control device (14S) and a low arm control device (LS).

The control device 41 includes a current detecting section 10, a transient sensing period detecting section 20, and a control section 30.

The current detecting section 10 detects the sense current flowing through the semiconductor element D1. The current detecting section 10 includes a resistor element Rs connected between the sense terminal S and the emitter terminal E of the semiconductor element D1, and detects the potential caused by the sense current that flows out from the sense terminal S flowing through the resistor element Rs. In this way, the sense current is detected as a voltage signal (also referred to as a detection signal) Isense, and the voltage signal is output to the transient sensing period detecting section 20 and the control section 30 described further below.

The transient sensing period detecting section 20 detects the transient rising and falling of the detection signal of the sense current, in response to the semiconductor element D1 being turned ON. The transient sensing period detecting section 20 receives the sense current detection signal Isense output from the current detecting section 10, and uses this input to output a signal TSENSE that is high level during periods when the detection signal is rising and periods when the detection signal is falling and is low level during all other periods. The circuit configuration and operation of the transient sensing period detecting section 20 are described further below.

The control section 30 controls the semiconductor element D1 according to the detection results of the transient sensing period, based on the detection signal of the sense current. The control section 30 receives the switching signal HIN, the sense current detection signal Isense output from the current detecting section 10, and the signal TSENSE output from the transient sensing period detecting section 20, and outputs a control signal HO to the gate of the semiconductor element D1. The circuit configuration and operation of the control section 30 are described further below.

The control device 42 is configured in a similar manner as the control device 41. However, the current detecting section 10 detects the sense current flowing through the semiconductor element D2. The transient sensing period detecting section 20 detects the transient sensing period of the sense current detection signal Isense, in response to the semiconductor element D2 being turned ON. The control section 30 receives the switching signal LIN, the sense current detection signal Isense output from the current detecting section 10, and the signal TSENSE output from the transient sensing period detecting section 20, and outputs a control signal LO to the gate of the semiconductor element D2 to control the semiconductor element D2.

Figure 2A:
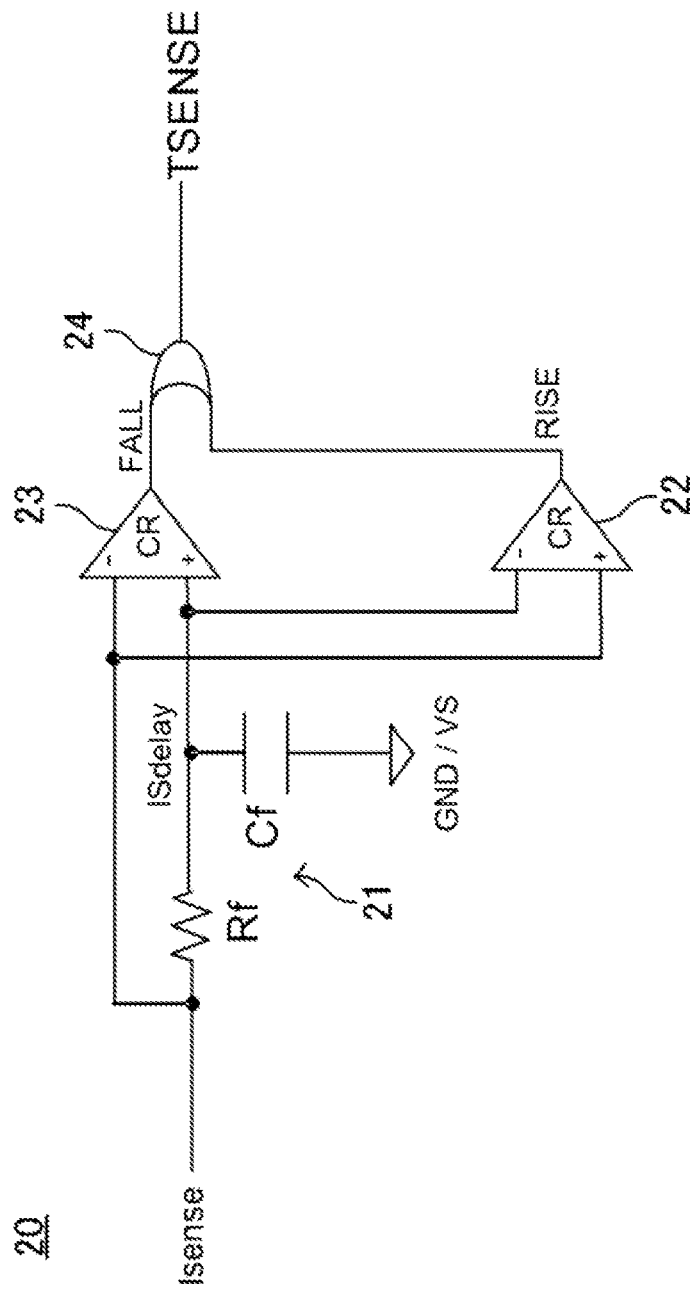
FIG. 2A shows a first configurational example of the transient sensing period detecting section.

FIG. 2A shows a first configurational example of the transient sensing period detecting section 20. The transient sensing period detecting section 20 includes an integrating circuit 21, comparators 22 and 23, and an OR (logical sum) circuit 24.

The integrating circuit 21 is formed by a resistor element Rf that is connected to the current detecting section 10 and receives the detection signal Isense and a capacitance element Cf connected between this resistor element Rf and the potential VS or GND. The integrating circuit 21 integrates the sense current detection signal Isense to generate a delayed signal ISdelay that is delayed relative to the detection signal Isense on the order of a time constant (e.g. approximately 0.02 μs), and outputs the delayed signal ISdelay to each of the negative input of the comparator 22 and the positive input of the comparator 23. It is possible to realize highly accurate protection corresponding to the characteristics of the semiconductor elements D1 and D2 by suitably determining this time constant.

Any delay circuit may be used instead of the integrating circuit 21, as long as it is possible to generate the delayed signal ISdelay having an appropriate time delay relative to the detection signal Isense.

The comparator 22 detects the transient rising of the detection signal Isense based on a difference between the sense current detection signal Isense and the delayed signal ISdelay thereof. The positive input of the comparator 22 is connected to the current detecting section 10 and receives the detection signal Isense, and the negative input of the comparator 22 is connected to the integrating circuit 21 and receives the delayed signal ISdelay. In this way, when the detection signal Isense is larger than the delayed signal ISdelay, the comparator 22 outputs a signal RISE that is high level, indicating the rising period of the detection signal Isense.

The comparator 23 detects the transient falling of the detection signal Isense based on a difference between the sense current detection signal Isense and the delayed signal ISdelay thereof. The positive input of the comparator 23 is connected to the integrating circuit 21 and receives the delayed signal ISdelay, and the negative input of the comparator 23 is connected to the current detecting section 10 and receives the detection signal Isense. In this way, the comparator 23 outputs a signal FALL that is high level, meaning that it is the falling period of the detection signal Isense, when the detection signal Isense is smaller than the delayed signal ISdelay.

The OR circuit 24 calculates the logical sum of the signals RISE and FALL of the comparators 22 and 23, and outputs the result as the signal TSENSE. In this way, it is possible to detect the transient sensing period based on the periods during which either of the signals RISE and FALL is high level, i.e. based on the rising and falling of the sense current detection signal Isense.

Figure 2B:
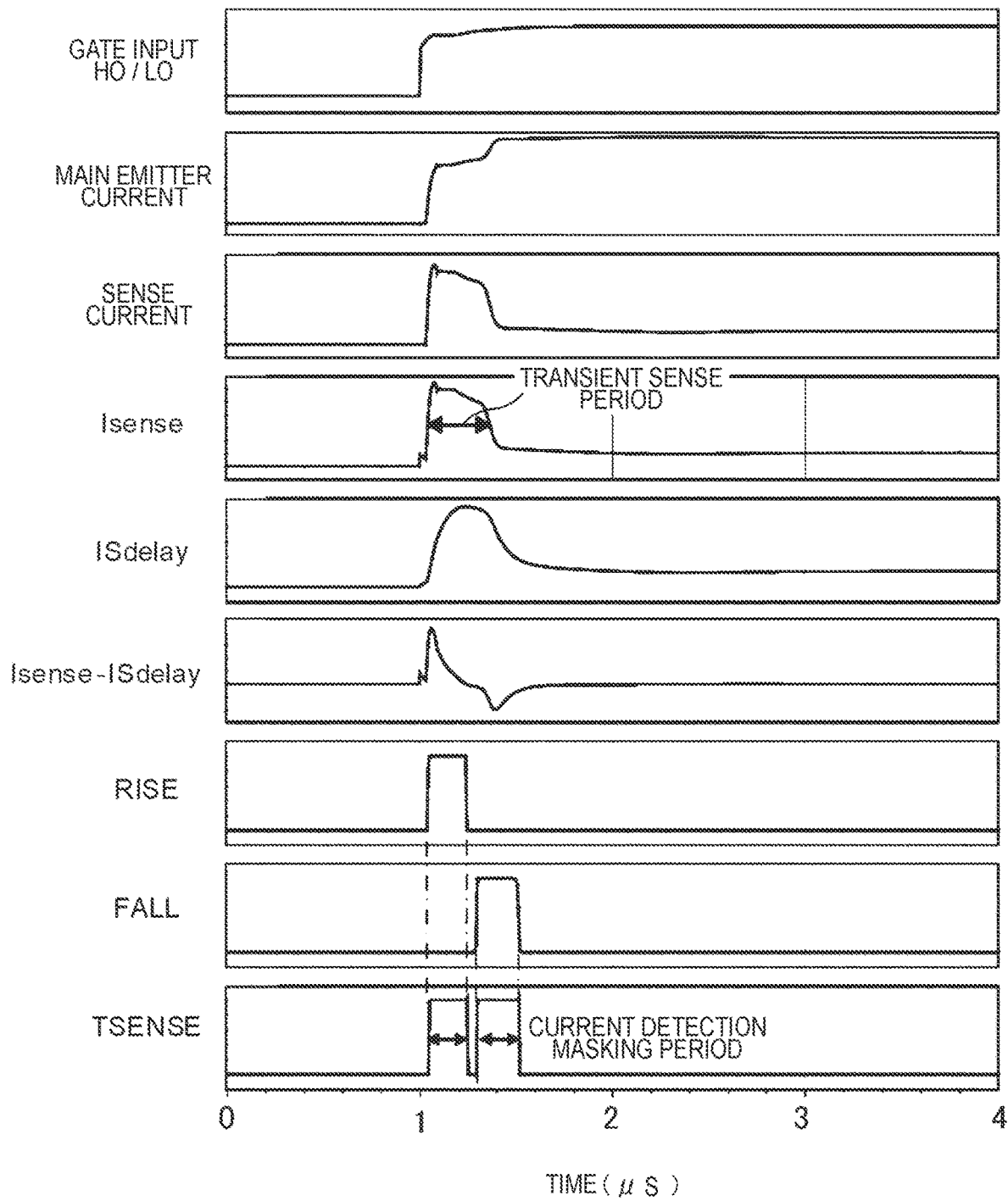
FIG. 2B shows an example of operational waveforms of the transient sensing period detecting section according to the first configurational example.

FIG. 2B shows an example of operational waveforms of the transient sensing period detecting section 10 according to the first configurational example. The topmost waveform is the waveform of the gate input signals HO and LO for driving the semiconductor elements D1 and D2. The gate input signals HO and LO rise at the timing 1 μs. The semiconductor elements D1 and D2 are driven by respectively receiving the gate input signals HO and LO, and each output the emitter current from the emitter thereof. Each emitter current is split into a main emitter current output from the emitter terminal E and the sense current output from the sense terminal S. The second and third waveforms from the top are waveforms of the main emitter current and the sense current, respectively. The main emitter current exhibits behavior of rising at the timing 1 μs, then increasing gradually, and then rising again at the timing 1.5 μs to become saturated. In contrast to this, the sense current exhibits behavior of rising at the timing 1 μs, then gradually decreasing, and then falling at the timing 1.5 μs to become saturated at a constant level. In this way, the sense current behaves differently than the main emitter current, i.e. by exhibiting different transient increasing and decreasing behavior from the rising at the timing 1 μs to the falling at the timing 1.5 μs. There is a concern that this behavior of the sense current could be erroneously detected as overcurrent.

The transient sensing period detecting section 20 detects the rising period, the falling period, and a period of neither falling nor rising for the sense current exhibiting the above behavior. The fourth waveform from the top in FIG. 2B shows the sense current detection signal Isense detected by the current detecting section 10. The detection signal Isense behaves in the same manner as the sense current, i.e. exhibits the same transient increasing and decreasing behavior from the rising at the timing 1 μs to the falling at the timing 1.5 μs. The period from the transient rising to the transient falling of the detection signal Isense is referred to as the transient sensing period. The fifth waveform from the top is the waveform of the delayed signal ISdelay output from the integrating circuit 21. The delayed signal ISdelay has more gradual rising and falling than the detection signal Isense, and is delayed on the order of the time constant. The sixth waveform from the top is the waveform of the difference between the detection signal Isense and the delayed signal ISdelay. This difference exhibits a peak at the rising time of the detection signal Isense, and exhibits a valley at the falling time of the detection signal Isense. The seventh and eighth waveforms from the top are the waveforms of the output signals RISE and FALL of the comparators 22 and 23, respectively. The output signal RISE is high level, indicating the rising period, during the period when the difference is positive. The output signal FALL is high level, indicating the falling period, during the period when the difference is negative. The ninth waveform from the top is the waveform of the output signal TSENSE. The output signal TSENSE is high level during the rising period and the falling period, and is low level, indicating the saturation period, between the rising and falling periods (which may be defined as the transient sensing period). As described further below, it is possible to identify overcurrent based on the transient response of the sense current, according to the length of the saturation period.

As described above, by using the transient sensing period detecting section 20 to detect the transient rising and falling of the detection signal based on the difference between the sense current detection signal Isense and the delayed signal ISdelay thereof, it is possible to uniquely detect the timings of the transient rising and falling, regardless of the magnitude of the detection signal Isense. Furthermore, it is possible to distinguish between the states of the sense current, i.e. the state of the transient rising and falling, the saturation state between the rising and falling states, and the steady ON state after the falling state.

Figure 3A:
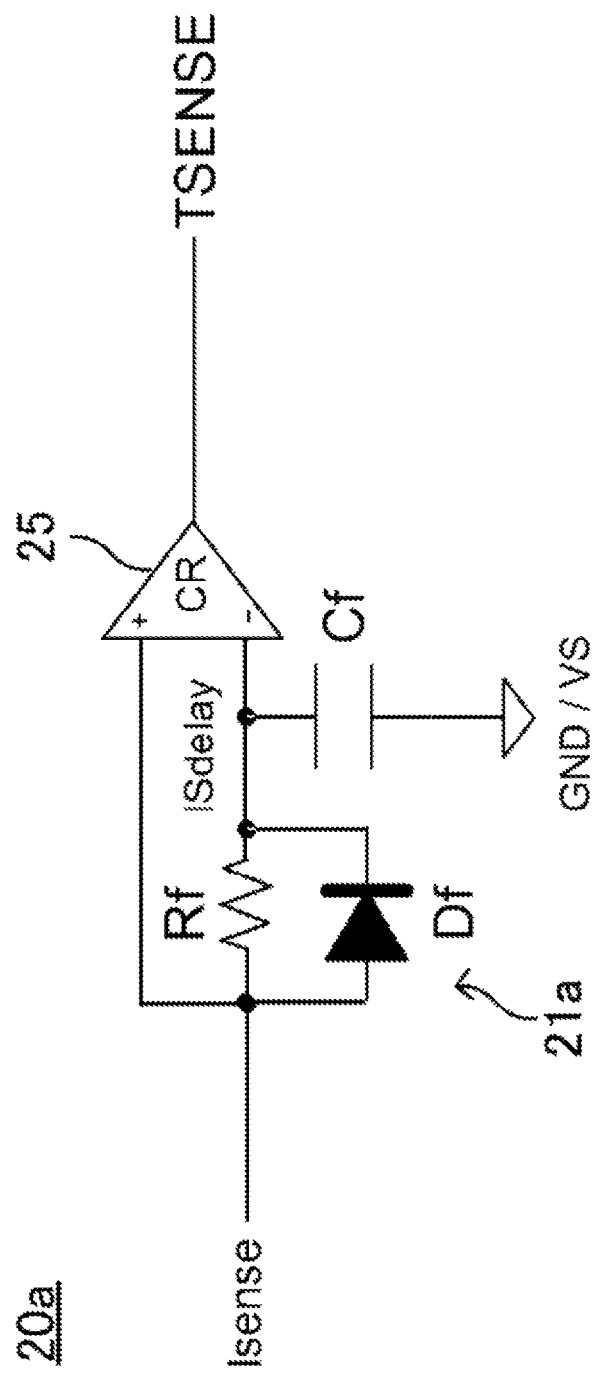
FIG. 3A shows a second configurational example of the transient sensing period detecting section.

FIG. 3A shows a transient sensing period detecting section 20a according to a second configurational example. The transient sensing period detecting section 20a includes an integrating circuit 21a and a comparator 25.

The integrating circuit 21a is formed by the resistor element Rf that is connected to the current detecting section 10 and receives the detection signal Isense, the capacitance element Cf connected between the resistor element Rf and the potential VS or GND, and a rectifier element Df connected in parallel with the resistor element Rf. The integrating circuit 21a generates the delayed signal ISdelay, which rises suddenly due to the rectification function of the rectifier element Df when the detection signal Isense rises, and falls gradually (e.g. on the order of 1 μs) due to the damping function of the resistor element Rf when the detection signal Isense falls.

The comparator 25 detects the transient rising of the detection signal Isense based on the difference between the sense current detection signal Isense and the delayed signal ISdelay thereof. The positive input of the comparator 25 is connected to the current detecting section 10 and receives the detection signal Isense, and the negative input of the comparator 25 is connected to the integrating circuit 21a and receives the delayed signal ISdelay. In this way, when the detection signal Isense is larger than the delayed signal ISdelay, the comparator 25 outputs the signal TSENSE as high level. By providing the rectifier element Df in the integrating circuit 21a, it is possible to increase the pulse width of the signal TSENSE.

Figure 3B:
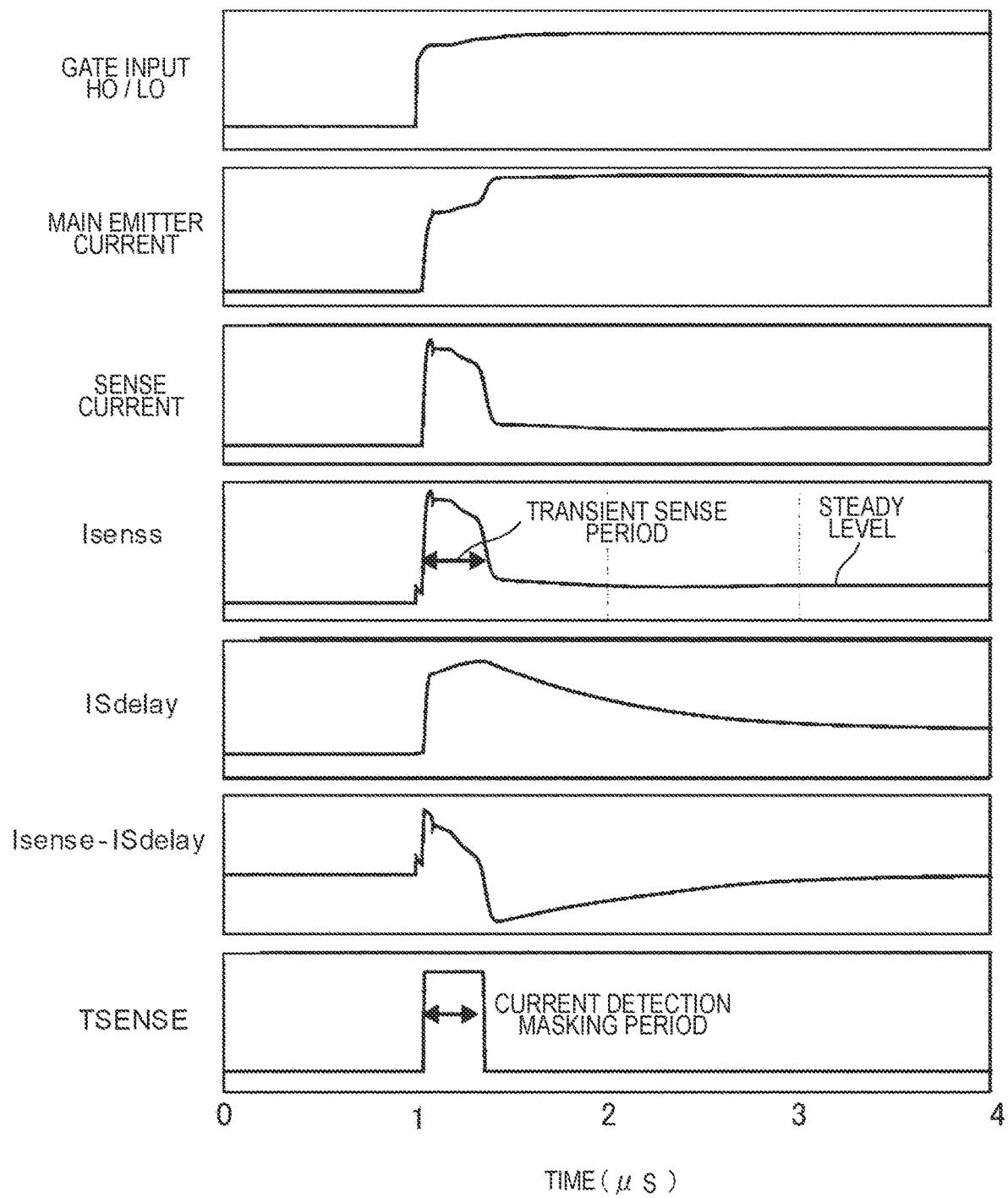
FIG. 3B shows an example of operational waveforms of the transient sensing period detecting section according to the second configurational example.

FIG. 3B shows examples of operational waveforms of the transient sensing period detecting section 20a according to the second configurational example. The topmost waveform is the gate input signals HO and LO for driving the semiconductor elements D1 and D2. The second and third waveforms from the top are waveforms of the main emitter current and the sense current, respectively. These waveforms exhibit the same behavior as these waveforms in FIG. 2B.

The transient sensing period detecting section 20a detects the transient sensing period for the sense current. The fourth waveform from the top in FIG. 3B shows the sense current detection signal Isense detected by the current detecting section 10. The detection signal Isense behaves in the same manner as the sense current, i.e. exhibits the same transient increasing and decreasing behavior from the rising at the timing 1 μs to the falling at the timing 1.5 μs. The fifth waveform from the top is the waveform of the delayed signal ISdelay output from the integrating circuit 21a. The delayed signal ISdelay rises suddenly in response to the rising of the detection signal Isense, and attenuates gradually in response to the falling of the detection signal Isense. The sixth waveform from the top is the waveform of the difference between the detection signal Isense and the delayed signal ISdelay. This difference rises suddenly when the detection signal Isense rises, then attenuates gradually, falls suddenly when the detection signal Isense falls, and then increases gradually to zero. The ninth waveform from the top is the waveform of the output signal TSENSE. The output signal TSENSE is high level during the period when the difference is positive.

The transient sensing period detecting section 20a may further be provided with a comparator that detects the transient falling of the detection signal Isense based on the difference between the sense current detection signal Isense and the delayed signal ISdelay thereof, and an OR circuit that calculates the logical sum of the output of this comparator and the output of the comparator 25 and outputs this logical sum as the output signal TSENSE. In this case, the output signal TSENSE is high during the rising period and the falling period, and is low, indicating the saturation period, between the rising period and the falling period. By providing the rectifier element Df in the integrating circuit 21a, it is possible to increase the pulse width of each of the rising period and the falling period in the signal TSENSE, and to decrease the width of the saturation period between the rising and falling periods.

In the transient sensing period detecting section 20 according to the first configurational example, the two comparators 22 and 23 are provided to detect the rising and falling of the detection signal Isense, but instead of this, the output signal TSENSE may be generated by detecting the rising and falling of the detection signal Isense and switching between the input of the detection signal Isense and the delayed signal ISdelay to the positive input and the negative input of a comparator, according to the detection result.

Figure 4:
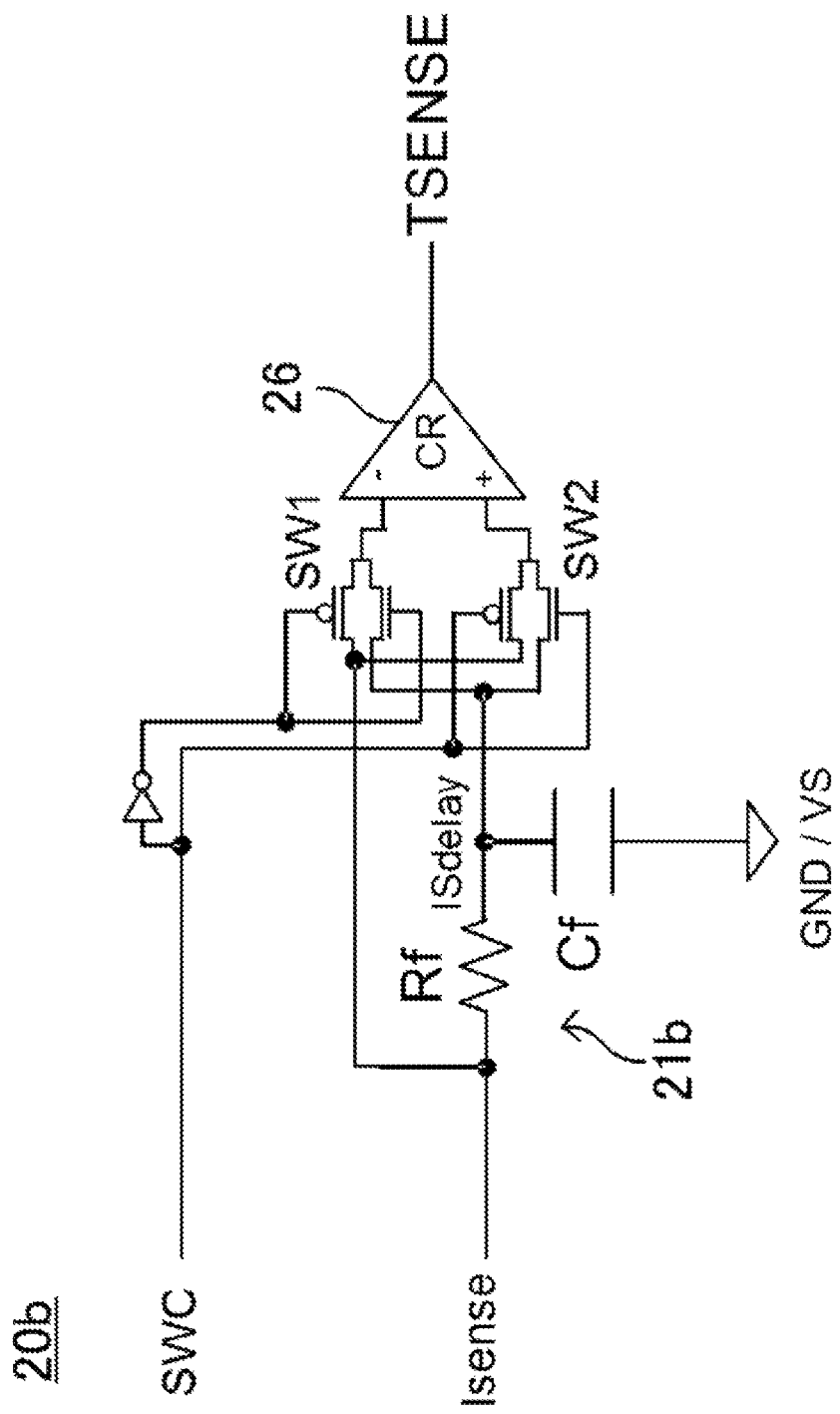
FIG. 4 shows a third configurational example of the transient sensing period detecting section.

FIG. 4 shows a transient sensing period detecting section 20b according to a third configurational example. The transient sensing period detecting section 20b includes an integrating circuit 21b, a comparator 26, and switches SW1 and SW2. As an example, due to the control section 30, the rising period and falling period of the detection signal Isense are detected based on the rising and falling of the switching signals HIN and LIN, and a state signal SWC that is high level during the rising period and low level during the falling period is input to the transient sensing period detecting section 20b.

The integrating circuit 21b is configured in a similar manner as the integrating circuit 21 described above.

The switches SW1 and SW2 are driven by the state signal SWC, input the detection signal Isense and the delayed signal ISdelay respectively to the positive input and the negative input of the comparator 26 during the rising period, and input the detection signal Isense and the delayed signal ISdelay respectively to the negative input and the positive input of the comparator 26 during the falling period.

The comparator 26 detects the transient rising and falling of the detection signal Isense based on the sense current detection signal Isense and the delayed signal ISdelay thereof. The comparator 26 outputs the signal TSENSE at high level when the detection signal Isense is larger than the delayed signal ISdelay during the rising and when the detection signal Isense is smaller than the delated signal ISdelay during the falling.

Figure 5:
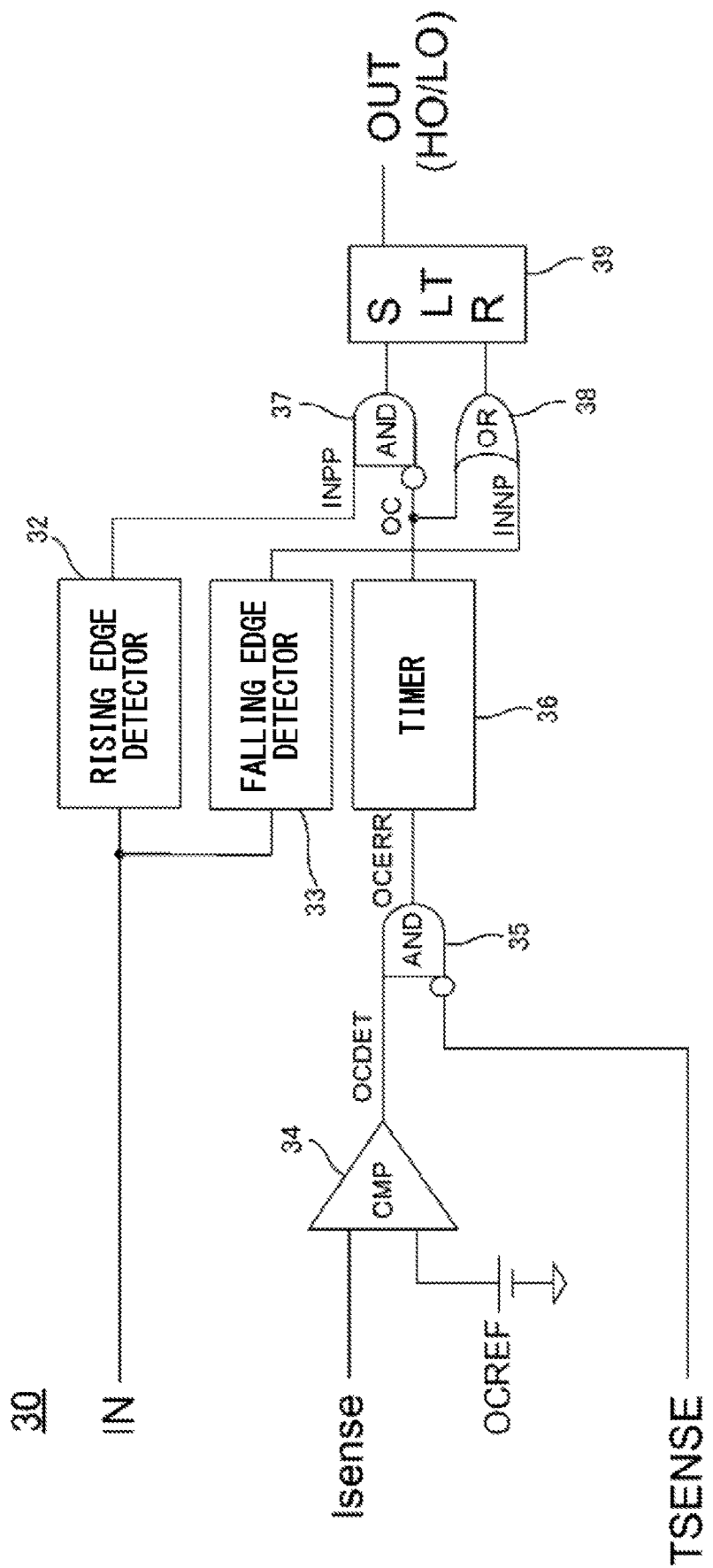
FIG. 5 shows a configurational example of the control section.

FIG. 5 shows a configuration of the control section 30. The control section 30 includes a rising edge detector 32, a falling edge detector 33, a comparator 34, a logical product (AND) circuit 35, a timer 36, a logical product (AND) circuit 37, a logical sum (OR) circuit 38, and a latch circuit 39.

The rising edge detector 32 and the falling edge detector 33 respectively detect the rising edge and the falling edge of the switching signal IN and output pulse signals INPP and INNP. Here, the pulse signals INPP and INNP include pulses that do not overlap with each other.

The comparator 34 compares the sense current detection signal Isense output from the current detecting section 10 to a reference OCREF, and outputs the comparison result OCDET. In this way, it is determined whether the sense current detection signal Isense has exceeded a predetermined threshold value. By suitably determining the reference OCREF, it is possible to realize protection with high accuracy corresponding to the characteristics of the semiconductor elements D1 and D2. Furthermore, the reference OCREF may be changed between the transient period and the steady ON period (or between the turn-OFF timing and the turn-ON timing), according to the current detection state, as described further below.

The AND circuit 35 calculates the logical product of the output OCDET of the comparator 34 and the logical negation of the output signal TSENSE of the transient sensing period detecting section 20, and outputs the calculation result OCERR. In this way, the saturation period between the rising period and the falling period is extracted from the output signal TSENSE of the transient sensing period detecting section 20.

The signal OCERR is low level when the output signal TSENSE is high level, and the comparison result of the detection signal Isense obtained by the comparator 34 is input to the timer 36. In this way, detection of overcurrent in the rising period and the falling period is restricted.

The timer 36 measures the time of the pulse width of the signal OCERR (i.e. the length of the transient sensing period) and outputs a pulse signal OC, meaning that overcurrent has been detected, when the measurement result has exceeded a predetermined time. By suitably determining the measurement time of the timer, it is possible to realize protection with high accuracy corresponding to the characteristics of the semiconductor elements D1 and D2.

The AND circuit 37 calculates the logical product of the output INPP of the rising edge detector 32 and the logical negation of the output OC of the timer 36.

The OR circuit 38 calculates the logical sum of the output INNP of the falling edge detector 33 and the output OC of the timer 36.

The latch circuit 39 generates OUT (HO and LO) based on the output of the AND circuit 37 and the output of the OR circuit 38, and inputs OUT to the semiconductor elements D1 and D2.

Figure 6A:
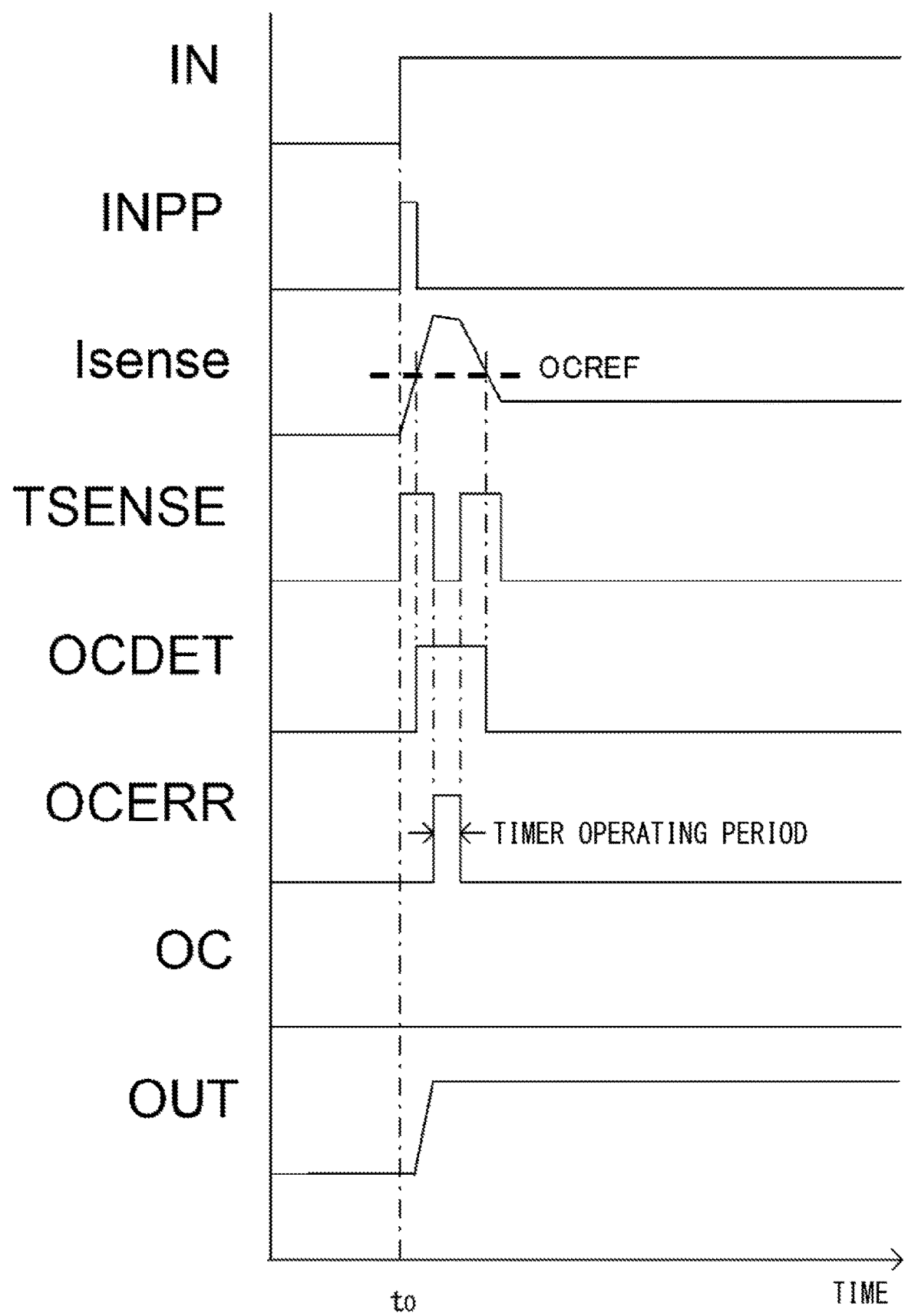
FIG. 6A shows examples of operational waveforms of the control section.

FIG. 6A shows examples of operational waveforms during turn-ON of the control section 30 in a case where overcurrent does not occur. The topmost waveform is the switching signal IN (HIN and LIN) input to the control section 30. The switching signal IN rises at the timing t0. The second waveform from the top is the waveform of the output INPP of the rising edge detector 32. The output INPP includes a pulse wave indicating that the switching signal IN has risen. The third and fourth waveforms from the top are waveforms of the sense current detection signal Isense output from the current detecting section 10 and the output signal TSENSE of the transient sensing period detecting section 20, respectively. The detection signal Isense exhibits transient rising and falling, and the output signal TSENSE includes, in correspondence with this transient rising and falling, two pulses that respectively exhibit a rising period and a falling period. The fifth waveform from the top is the waveform of the output OCDET of the comparator 34. The output OCDET is high level when the detection signal Isense is larger than the reference OCREF. The sixth waveform from the top is the waveform of the output OCERR of the AND circuit 35. The output OCERR is high level during the period when the detection signal Isense exceeds the reference OCREF and the output signal TSENSE is saturated. The seventh waveform from the top is the waveform of the output OC of the timer 36. Here, since the transient sensing period is shorter than the time predetermined by the timer, the overcurrent is not detected and the output OC is low level. The eighth waveform from the top is the waveform of the output signal OUT of the latch circuit 39. The output signal OUT rises in response to the rising of the switching signal IN at the timing t0 and, since overcurrent is not detected, remains at high level. In such a case, the semiconductor elements D1 and D2 are turned ON in response to the rising of the switching signal IN at the timing t0.

Figure 6B:
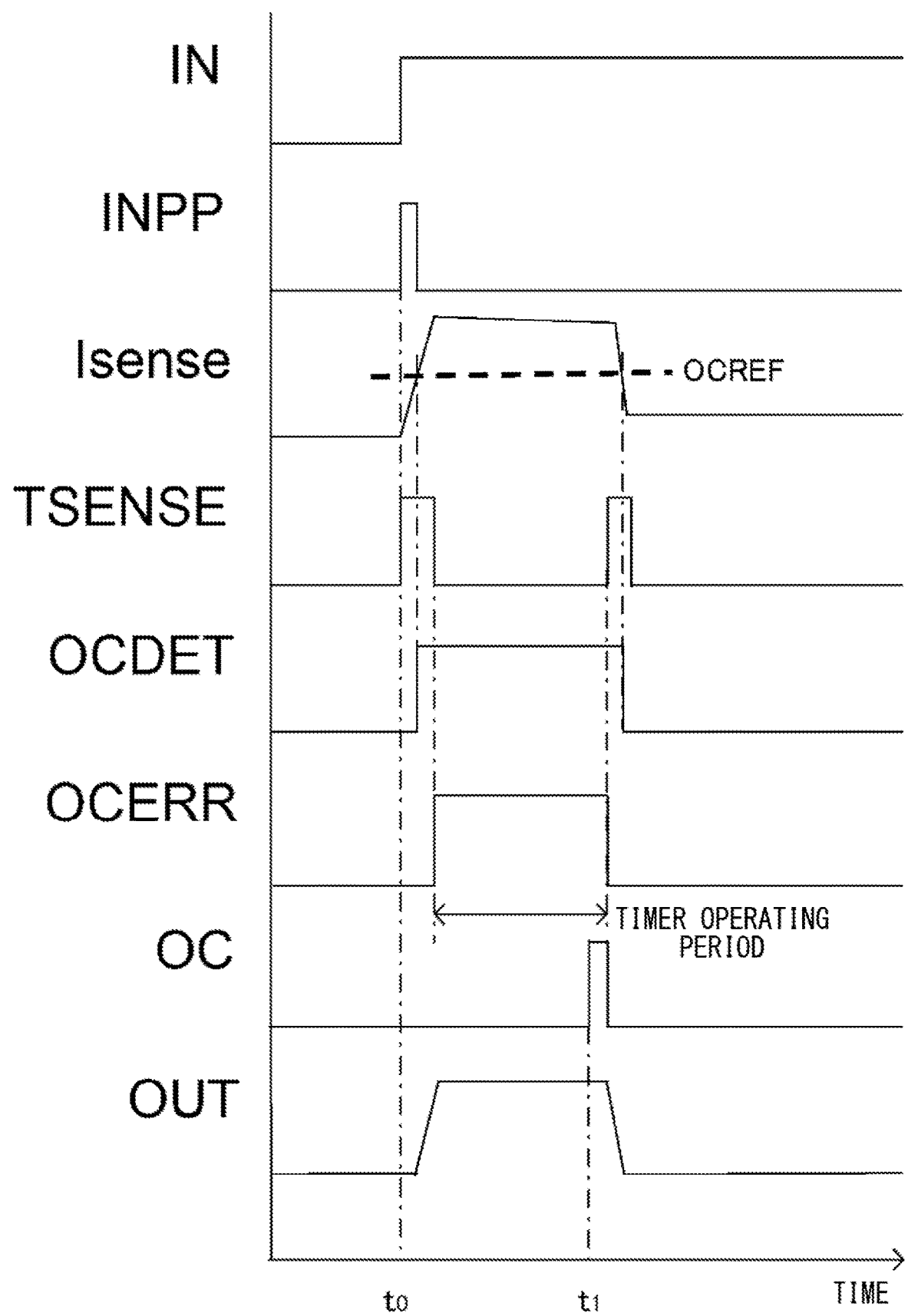
FIG. 6B shows other examples of operational waveforms of the control section.

FIG. 6B shows examples of operational waveforms of the control section 30 when the semiconductor elements D1 and D2 are turned ON, in a case where overcurrent occurs. The topmost waveform is the switching signal IN (HIN and LIN) input to the control section 30. The switching signal IN rises at the timing t0, in the same manner as in the previous example. The second waveform from the top is the waveform of the output INPP of the rising edge detector 32. The output INPP includes a pulse wave indicating that the switching signal IN has risen, in the same manner as in the previous example. The third and fourth waveforms from the top are waveforms of the sense current detection signal Isense output from the current detecting section 10 and the output signal TSENSE of the transient sensing period detecting section 20, respectively. The detection signal Isense exhibits a longer transient sensing period than in the previous example, and the output signal TSENSE includes, in correspondence with this transient rising and falling, two pulses that respectively exhibit a rising period and a falling period distanced farther from each other than in the previous example. The fifth and sixth waveforms from the top are the waveform of the output OCDET of the comparator 34 and the waveform of the output OCERR of the AND circuit 35, respectively. The seventh waveform from the top is the waveform of the output OC of the timer 36. Here, since the transient sensing period exhibited by the output OCERR is longer than the predetermined time, the output OC of the timer 36 is high level, meaning that overcurrent has been detected at the timing t1. The eighth waveform from the top is the waveform of the output signal OUT of the latch circuit 39. The output signal OUT becomes high level in response to the rising of the switching signal IN at the timing t0, and becomes low level in response to the overcurrent being detected at the timing t1. In such a case, the semiconductor elements D1 and D2 are turned ON in response to the rising of the switching signal IN at the timing t0, and then are turned off to be protected in response to the overcurrent being detected by the control section 30 at the timing t1.

As described above, when the sense current detection signal Isense exceeds a predetermined threshold value (i.e. the reference OCREF) and the transient sensing period has exceeded the predetermined time, the control section 30 determines that overcurrent, and not a transient response of the sense current, has occurred, and turns OFF the semiconductor elements D1 and D2 to protect them from the overcurrent.

The output signal OUT becomes low level when the switching signal IN falls, and remains at low level if overcurrent is detected. In such a case, the semiconductor elements D1 and D2 are turned OFF in response to the falling of the switching signal IN, or are kept in the OFF state if overcurrent is detected.

The semiconductor elements D1 and D2 can exhibit transient rising and falling in the sense current when turned OFF as well, in a similar manner as when turned ON. Therefore, the control section 30 may detect the overcurrent in response to the sense current detection signal Isense exceeding the threshold value during the steady ON period after the falling of the switching signal IN in the transient sensing period caused by the rising of the switching signal IN. Here, the threshold value in the steady ON period may be lower than the threshold value in the transient sensing period.

The transient sensing period detecting section 20 may include a state machine that tracks transitions between current detection states corresponding to each of the rising period, the falling period, the transient sensing period, and the steady ON period.

Figure 7:
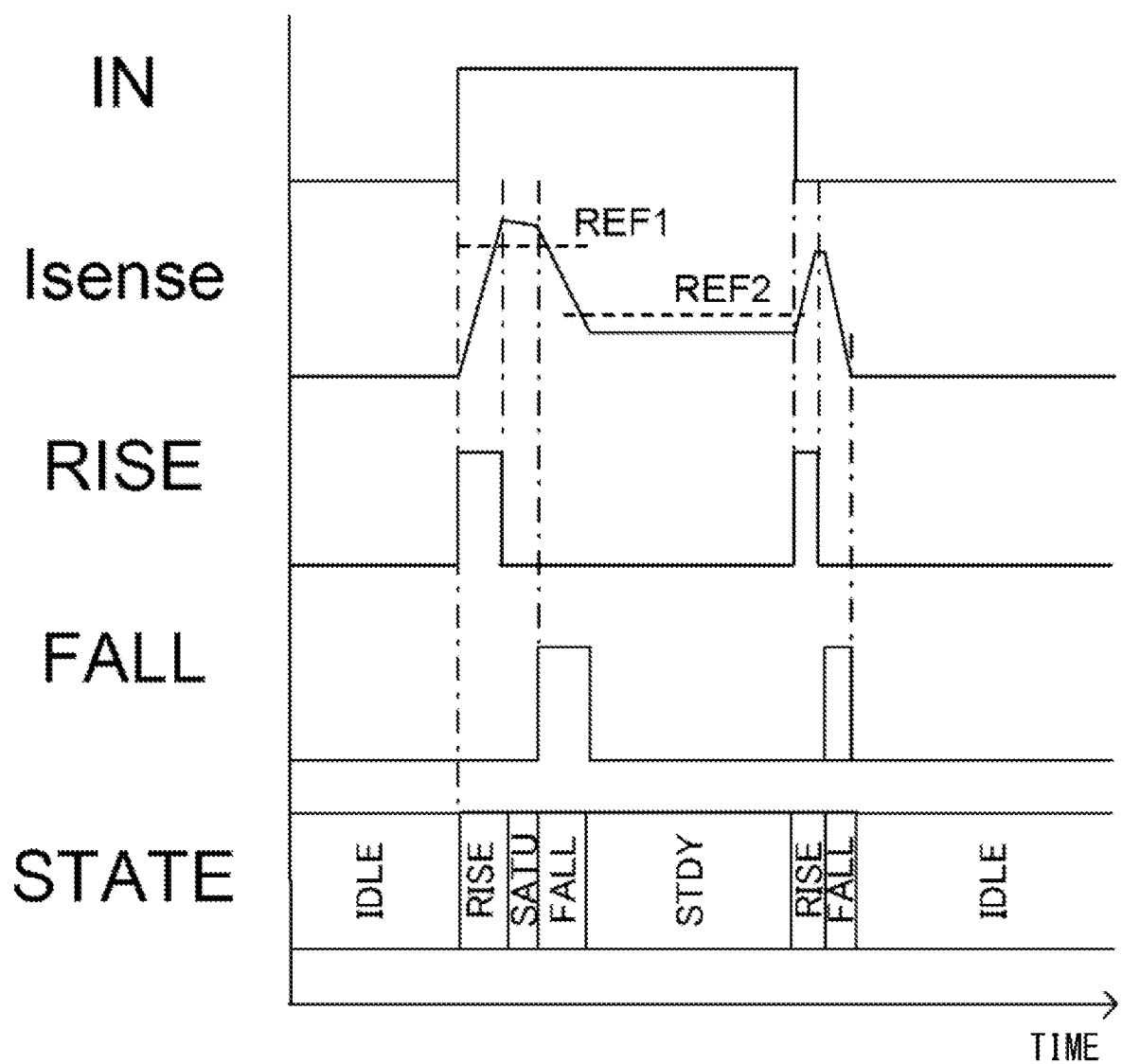
FIG. 7 shows examples of transitions of the current detection state in a time chart format.

FIG. 7 shows examples of transitions of the current detection state according to the transient sensing period detecting section 20. The topmost waveform is the waveform of the switching signal IN input to the control section 30. The semiconductor elements D1 and D2 are turned ON in response to the rising of the switching signal IN, and are turned OFF in response to the falling of the switching signal IN. The second waveform from the top is the waveform of the sense current detection signal Isense. The detection signal Isense exhibits transient change when the semiconductor element D1 or D2 is turned ON in response to the rising of the switching signal IN, and exhibits transient change when the semiconductor element D1 or D2 is turned OFF in response to the falling of the switching signal IN. The degree of the increase in the transient behavior during turn-OFF is somewhat smaller than during turn-ON. The third and fourth waveforms from the top are waveforms of the output signals RISE and FALL of the comparators 22 and 23, respectively. The output signal RISE includes two pulses respectively exhibiting a rising period during turn-ON and a rising period during turn-OFF. The output signal FALL includes two pulses respectively exhibiting a falling period during turn-ON and a falling period during turn-OFF. The fifth waveform from the top indicates the current detection state. The current detection state passes through an idle period (IDLE) before the rising of the switching signal IN, a rising period (RISE) due to the sense current detection signal transiently rising in response to the rising of the switching signal IN, then a saturation period (SATU) until a falling period, a falling period (FALL) due to the detection signal transiently falling, a steady ON period (STDY) following the falling period, a rising period (RISE) due to the sense current detection signal transiently rising in response to the falling of the switching signal IN, a falling period (FALL) due to the detection signal transiently falling, and an idle period (IDLE) that follows the falling period.

Figure 8:
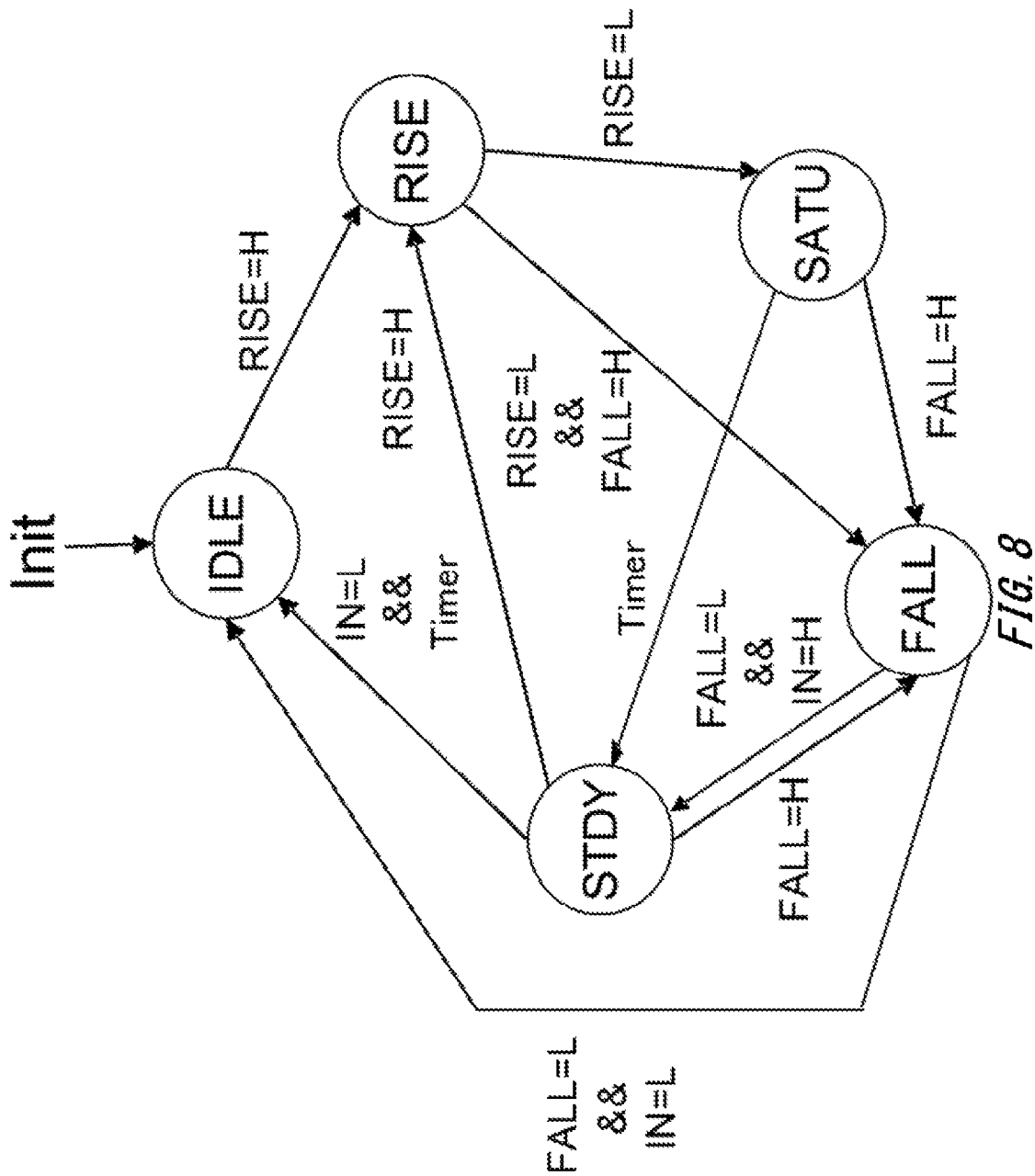
FIG. 8 shows examples of transitions of the current detection state in a block diagram format.

FIG. 8 shows examples of transitions of the current detection state according to the transient sensing period detecting section 20. The state machine of the transient sensing period detecting section 20 tracks the current detection state by performing the state transitions shown in FIG. 8, according to the current detection results. The current detection state starts from the idle period (IDLE). In the idle period, the current detection state transitions to the rising period (RISE) due to the signal RISE becoming high level. In the rising period, the current detection state transitions to the saturation period (SATU) due to the signal RISE becoming low level or transitions to the falling period (FALL) without passing through the saturation period due to the signal RISE becoming low level and the signal FALL becoming high level. In the saturation period, the current detection state transitions to the falling period due to the signal FALL becoming high level or transitions to the steady ON period (STDY) due to a predetermined time having passed since transitioning to the saturation period. In the falling period, the current detection state transitions to the steady ON period due to the signal FALL being low level and the switching signal IN being high level or transitions to the idle period due to the signal FALL being low level and the switching signal IN being low level. In the steady ON period, the current detection state transitions to the falling period due to the signal FALL becoming high level, transitions to the rising period due to the signal RISE becoming high level, or transitions to the idle period due to the switching signal IN being low level and the predetermined time having passed from the transition to the steady ON period.

When applied to the example of the state transitions shown in FIG. 7, the current detection state starts from the idle period, transitions to the rising period due to the sense current detection signal transiently rising (i.e. RISE=H) in response to the rising of the switching signal IN, transitions to the saturation period due to the rising period ending (RISE=L), transitions to the falling period due to the detection signal transiently falling (FALL=H), transitions to the steady ON period due to the falling period ending (FALL=L) and the switching signal IN being high level (IN=H), transitions to the rising period due to the sense current detection signal transiently rising (RISE=H) in response to the switching signal IN falling, transitions to the falling period due to the rising period ending (RISE=L) and the detection signal transiently falling (FALL=H), and returns to the idle period due to the switching signal IN being low level (IN=L) and the falling period ending (FALL=L). In this way, it is possible to identify the current detection state using the transient sensing period detecting section 20.

The threshold value for the sense current detection signal Isense may be changed between the saturation period, the steady ON period, and the idle period. Here, the threshold value for the saturation period may be set to be higher, and the threshold values for the steady ON period and the idle period may be set to be lower.

According to the control devices 41 and 42 of the present embodiment, each control device includes a current detecting section 10 that detects the sense current for the current flowing through the corresponding semiconductor element D1 or D2, a transient sensing period detecting section 20 that detects a transient sensing period from the transient rising to the transient falling of the sense current detection signal in response to the corresponding semiconductor element D1 or D2 being turned ON, and a control section 30 that controls the corresponding semiconductor element D1 or D2 according to the detection results of the transient sensing period, based on the sense current detection signal. By using the transient sensing period detecting section 20 to detect the transient sensing period from the transient rising to the transient falling of the sense current detection signal corresponding to the turn-ON of the semiconductor element D1 or D2 and using the control section 30 to control the semiconductor element D1 or D2 according to the detection results of the transient sensing period, based on the sense current detection signal, it is possible to identify overcurrent based on the transient response of the sense current according to the detection results of the transient sensing period, and to actively protect the semiconductor element.

In the control devices 41 and 42 of the present embodiment, the slope (dv/dt) of the gate input signals HO and LO may be changed by switching of the gate resistance or the like, according to the length of the rising period (RISE) and the falling period (FALL).

The control devices 41 and 42 according to the present embodiment are not limited to protecting conventionally used silicon semiconductor elements, and are effective for controlling switching for next-generation semiconductor elements such as SiC semiconductor elements and GaN semiconductor elements and for identifying overcurrent based on the transient response of the sense current and actively protecting these semiconductor elements.

In the current detecting section 10 of each control device 41 and 42 according to the present embodiment, the sense current detection is not limited to using the resistor element Rs, and any method may be used to detect the sense current, such as detecting the sense current by using a magnetic sensor to detect a magnetic field generated by the sense current. According to the control devices 41 and 42 of the present embodiment, it is possible to identify overcurrent based on the transient response of the sense current using any current detection method, and to actively protect the semiconductor elements.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10 ... current detecting section; 20, 20a, 20b ... transient sensing period detecting section; 21, 21a, 21b ... integrating circuit; 22, 23 ... comparator; 24 ... OR circuit; 25, 26 ... comparator; 30 ... control section; 32 ... rising edge detector; 33 ... falling edge detector; 34 ... comparator; 35 ... AND circuit; 36 ... timer; 37 ... AND circuit; 38 ... OR circuit; 39 ... latch circuit; 41, 42 ... control device; 100 ... semiconductor device; D1, D2 ... semiconductor element; SW1, SW2 ... switch

What is claimed is:

1. A control device comprising:
a current detecting section that detects a sense current for a current flowing through a semiconductor element;
a transient sensing period detecting section that detects a transient sensing period between a transient rising to a transient falling of a detection signal of the sense current, in response to the semiconductor element being turned ON; and
a control section that turns OFF the semiconductor element when the sense current exceeds a predetermined threshold value for a predetermined time that exceeds the transient sensing period; wherein the transient sensing period detecting section includes a first comparator having a first input terminal which receives the detection signal, a second input terminal which receives the detection signal that is delayed, and a first output terminal which outputs the transient sensing period, and the control section includes a second comparator having a third input terminal which receive the detection signal, a fourth input terminal which receives a reference voltage corresponding to the predetermined threshold value, and a second output terminal which outputs an overcurrent indicating signal for turning OFF the semiconductor element.

2. The control device according to claim 1, wherein
the current detecting section detects a potential occurring in a resistor element through which the sense current flows.

3. The control device according to claim 1, wherein the transient sensing period detecting section detects the transient rising and transient falling of the detection signal based on a difference between the detection signal of the sense current and the delayed signal of the detection signal.

4. The control device according to claim 1, wherein the control section turns OFF the semiconductor element when the detection signal of the sense current exceeds the predetermined threshold value and the transient sensing period exceeds a predetermined time.

5. The control device according to claim 1, wherein
the transient sensing period detecting section detects a rising period corresponding to the transient rising, a falling period corresponding to the transient falling, and the transient sensing period between the transient rising and the transient falling of the detection signal of the sense current, and
the control section detects overcurrent in response to the detection signal of the sense current having exceeded a predetermined first threshold value during the transient sensing period.

6. The control device according to claim 5, wherein
the control section is prevented from detecting overcurrent during the rising period and during the falling period.

7. The control device according to claim 5, wherein
the transient sensing period detecting section further detects a steady ON period from after the falling period to when the semiconductor element is turned OFF, and
the control section detects overcurrent in response to the detection signal of the sense current exceeding a second threshold value, which is lower than the first threshold value, during the steady ON period.

8. The control device according to claim 7, wherein
the transient sensing period detecting section includes a state machine that tracks state transition among states corresponding respectively to the rising period, the falling period, the transient sensing period, and the steady ON period.

9. A semiconductor device comprising:
the semiconductor element; and
the control device according to claim 1.

10. A semiconductor device comprising:
a semiconductor element; and
a control circuit that protects the semiconductor element in response to the semiconductor element being turned ON, comprising:
a current detecting circuit that detects a sense current flowing through the semiconductor element;

a transient sensing period circuit that detects a transient sensing period between a transient rising to a transient falling of the sense current, in response to the semiconductor element being turned ON; wherein the transient sensing period circuit includes a first comparator having a first input terminal which receives a detection signal corresponding to the sense current, a second input terminal which receives the detection signal that is delayed, and a first output terminal which outputs the transient sensing period; and the control circuit includes a second comparator having a third input terminal which receive the detection signal, a fourth input terminal which receives a reference voltage corresponding to a predetermined threshold value, and a second output terminal which outputs an overcurrent indicating signal for turning OFF the semiconductor element, the control circuit turning OFF the semiconductor element according to the overcurrent indicating signal in response to:

the sense current exceeds the predetermined threshold value for a predetermined time;

the transient sensing period circuit has detected the transient rising of the sense current; and the transient sensing period circuit has not detected the transient falling of the sense current.

11. The semiconductor device of claim 10 wherein:
the semiconductor element is a switching element.

12. The semiconductor device of claim 10 wherein:
the semiconductor element is an insulated gate bipolar transistor, and
the control circuit controls a gate of the insulated gate bipolar transistor.

13. The semiconductor device of claim 10 wherein: the semiconductor element is a metal oxide semiconductor field effect transistor, and the control circuit controls a gate of the metal oxide semiconductor field effect transistor.

14. The control device according to claim 1, wherein
the control section maintains turning ON the semiconductor element when the sense current exceeds the predetermined threshold value for a first time which is shorter than the transient sensing period.

15. A control device comprising:
a sense resistor in which a sense current for a current flowing through a semiconductor element in response to the semiconductor element being turned ON flows;
an overcurrent detection section that detects a detection signal of the sense resistor and outputs a detection result for turning OFF the semiconductor element;

a transient sensing period detecting section that detects a transient rising period corresponding to a transient rising of the detection signal of the sense resistor, in response to the semiconductor element being turned ON; and a control section that turns OFF the semiconductor element based on the detection result, wherein the transient sensing period detecting section includes a first comparator having a first input terminal which receives the detection signal, a second input terminal which receives the detection signal that is delayed, and a first output terminal which outputs the transient rising period, the overcurrent detection section includes a second comparator having a third input terminal which receive the detection signal, a fourth input terminal which receives a reference voltage, and a second output terminal which outputs the detection result, and the control section prohibits turning OFF the semiconductor element based on the detection result during the transient rising period, thereby to maintain turning ON the semiconductor element during the transient rising period.

16. The control device according to claim 15, wherein the transient sensing period detection section further detects a transient falling period corresponding to a transient falling of the detection signal of the sense resistor, in response to the semiconductor element being turned ON.

17. The control device according to claim 16, wherein
the control section turns OFF the semiconductor element when the overcurrent detection section outputs the detection result and an output time of the detection result exceeds a predetermined period corresponding to a transient sensing period between the transient rising period and the transient falling period.

18. The control device according to claim 17, further comprising:
a timer to determine the predetermined period, wherein
the control section prohibits turning OFF the semiconductor element when the overcurrent detection section outputs the detection result and the output time of the detection result doesn't exceed the predetermined period, thereby to maintain turning ON the semiconductor element during the transient rising period, the transient sensing period, and the transient falling period, and
a switching operation of the semiconductor element controls the current flowing through a load.

* * * * *